United States Patent
Cheng et al.

[11] Patent Number: 5,672,069
[45] Date of Patent: Sep. 30, 1997

[54] CONNECTOR WITH EJECTOR

[75] Inventors: Lee-Ming Cheng, Cupertino; Caesar Chen, Fountain Valley, both of Calif.; Gwou-Jung Tseng, Tu-Chen; Tsun Shen Shao, Pan-Chao, both of Taiwan; Edmond Choy, Union City, Calif.

[73] Assignee: Hon Hai Precision Ind. Co., Ltd., Taipei, Taiwan

[21] Appl. No.: 673,070

[22] Filed: Jul. 1, 1996

Related U.S. Application Data

[63] Continuation-in-part of Ser. No. 558,967, Nov. 13, 1995, Pat. No. 5,558,528.

[51] Int. Cl.$^6$ .................................................. H01R 13/62
[52] U.S. Cl. ................................................................. 439/160
[58] Field of Search ..................................... 439/152–160

[56] References Cited

U.S. PATENT DOCUMENTS

| | | | |
|---|---|---|---|
| 4,410,222 | 10/1983 | Enomoto et al. | 439/157 |
| 4,579,408 | 4/1986 | Sasaki | 439/157 |
| 4,761,141 | 8/1988 | Hawk et al. | 439/157 |
| 5,057,029 | 10/1991 | Noorily | 439/157 |
| 5,181,857 | 1/1993 | Layser | 439/157 |
| 5,273,447 | 12/1993 | Heiney et al. | 439/160 |
| 5,429,523 | 7/1995 | Tondreault | 439/160 |
| 5,470,240 | 11/1995 | Suzuki | 439/160 |
| 5,511,985 | 4/1996 | Noschese et al. | 439/157 |
| 5,558,528 | 9/1996 | Cheng et al. | 439/160 |

*Primary Examiner*—Neil Abrams
*Assistant Examiner*—Brian J. Biggi

[57] ABSTRACT

A card edge connector (10) includes an elongated housing (12) defining a central slot (14) along its lengthwise direction for receiving a card (100) therein. A plurality of passageways (16) are formed in the housing (12) by two sides of the slot (14). Two cavities (18) are formed at two opposite ends of the housing (12) for receiving a pair of corresponding ejectors (20) therein, respectively. A pair of retention bars (34) are positioned adjacent each end of the housing (12) and respectively on two sides of the slot (14). Each ejector (20) includes a main body (22) which is substantially higher than the adjacent retention bars (34). A pair of stopper blocks (32) are formed on two side surfaces (28) of the main body (22) for engagement with the corresponding retention bars (34), respectively, when the ejector (20) is in the vertical position. A locking peg (36) formed at the top of the main body (22) of the ejector (20), horizontally extends toward the central slot (14) and is substantially positioned over the corresponding retention bars (34).

11 Claims, 12 Drawing Sheets

CONNECTOR WITH EJECTOR

BACKGROUND OF THE INVENTION

1. Field of the Invention

This application is a continuation-in-part of application Ser. No. 08/558,967 filed Nov. 13, 1995, now U.S. Pat. No. 5,558,528. The invention relates particularly to the card edge connector having at least one ejector at its one lengthwise end for releasably locking a module or card within the card edge connector.

2. The Prior Art

The copending parent application Ser. No. 08/558,967 filed Nov. 13, 1995, discloses a card edge connector having a pair of ejectors at two opposite lengthwise ends. In such type practice, the card is generally retained within the connector by means of the a first retention force generated by the normal engagement forces of the contacts of the connector against the circuit pads printed on the bottom edge portion of the card, and a second retention force derived from two pairs of retention bars positioned adjacent two opposite ends, respectively, which sandwich the side portions of the card. Anyhow, if the card is of a higher profile or such connector incorporating the card is operated in a horizontal manner, i.e., the connector being mounted on a mother board which stands vertically in the computer case and then the card, which is inserted into the connector, being substantially in a horizontal state in the computer case, the foregoing structure of such card edge connector may not be reliably competent to cooperate with the card, especially when there is a greater vibration occurring thereabouts.

Therefore, an object of the invention is to provide a card edge connector which has the basic structure of the copending parent application, and further includes means for latchable engagement with the inserted card in the connector so as to efficiently retainably receive a taller module therein and/or be adapted to be in a horizontal application manner.

SUMMARY OF THE INVENTION

According to an aspect of the invention, a card edge connector includes an elongated housing defining a central slot along its lengthwise direction for receiving a card therein. A plurality of passageways are formed in the housing by two sides of the slot. Two cavities are formed at two opposite ends of the housing for receiving a pair of corresponding ejectors therein, respectively. A pair of retention bars are positioned adjacent each end of the housing and respectively on two sides of the slot. Each ejector includes a main body which is substantially higher than the adjacent retention bars. A pair of stopper blocks are formed on two side surfaces of the main body for engagement with the corresponding retention bars, respectively, when the ejector is in the vertical position. A locking peg formed at the top of the main body of the ejector, horizontally extends toward the central slot and is substantially positioned over the corresponding retention bars.

DETAILED DESCRIPTION OF THE PREFERRED EMBODIMENTS

Figure 1:
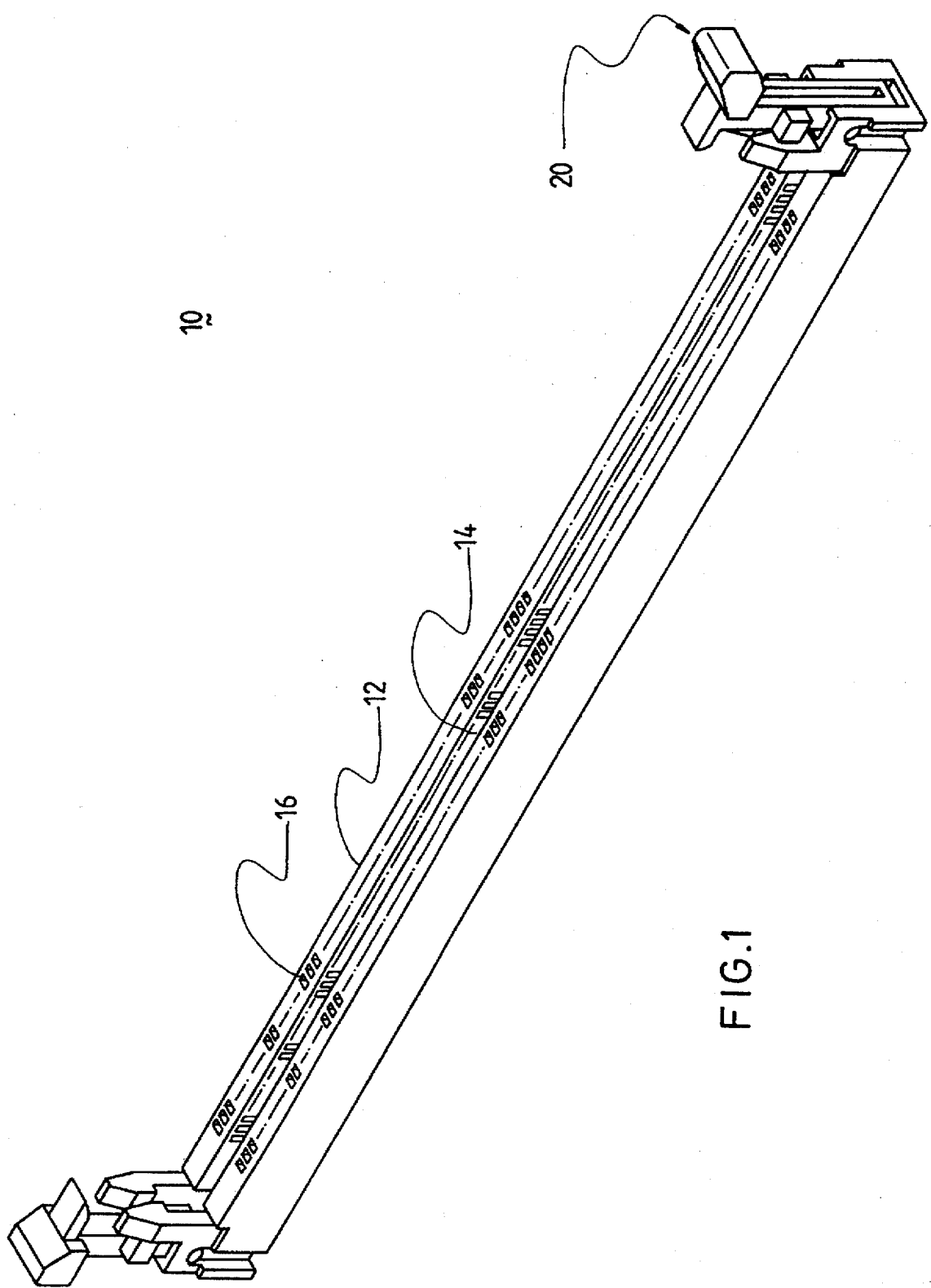
FIG. 1 is a perspective view of a first embodiment of an assembled card edge connector according to the invention.
Figure 2:
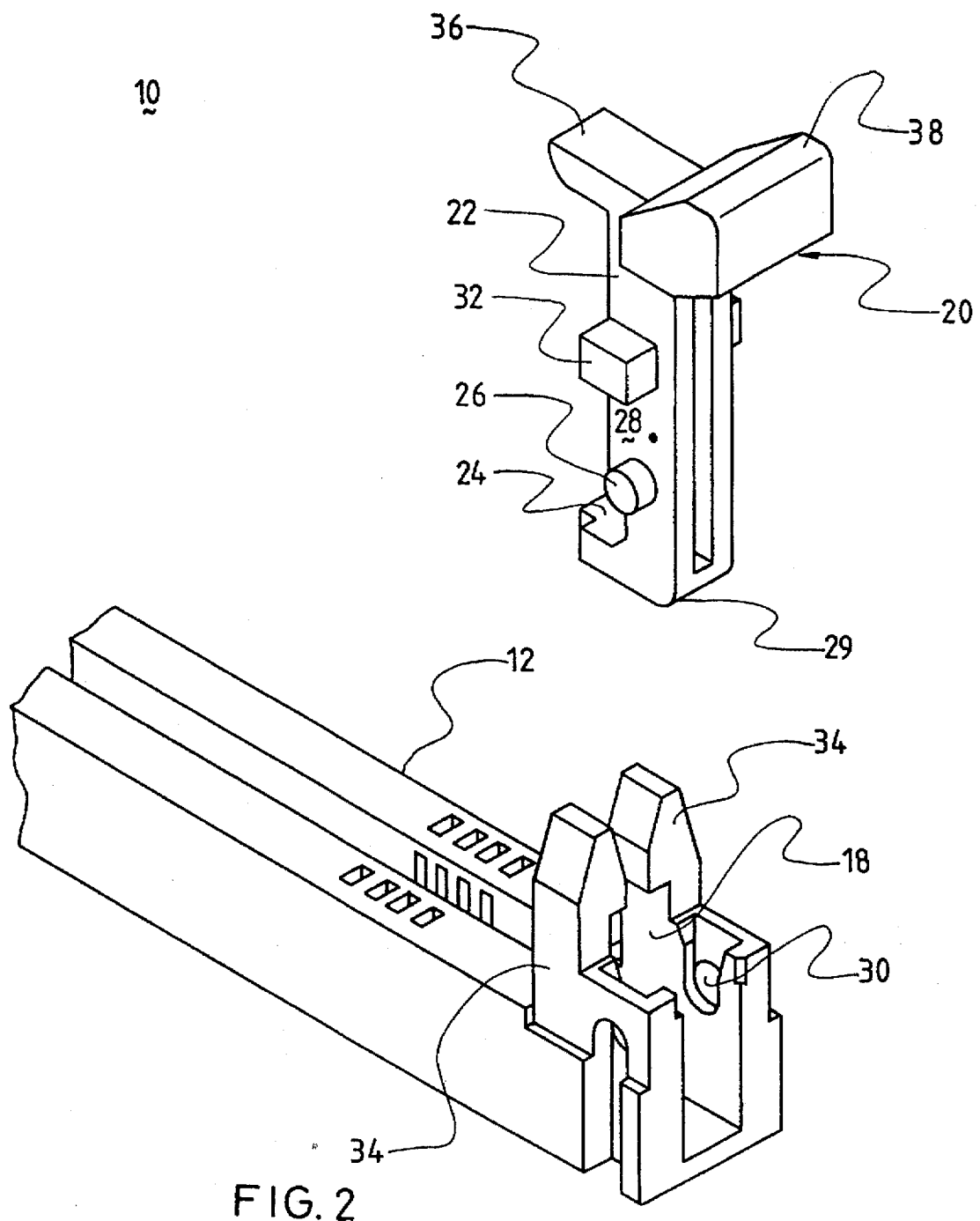
FIG. 2 is a fragmentary exploded perspective view of the card edge connector of FIG. 1 to show the ejector and the cavity of the housing.
Figure 3:
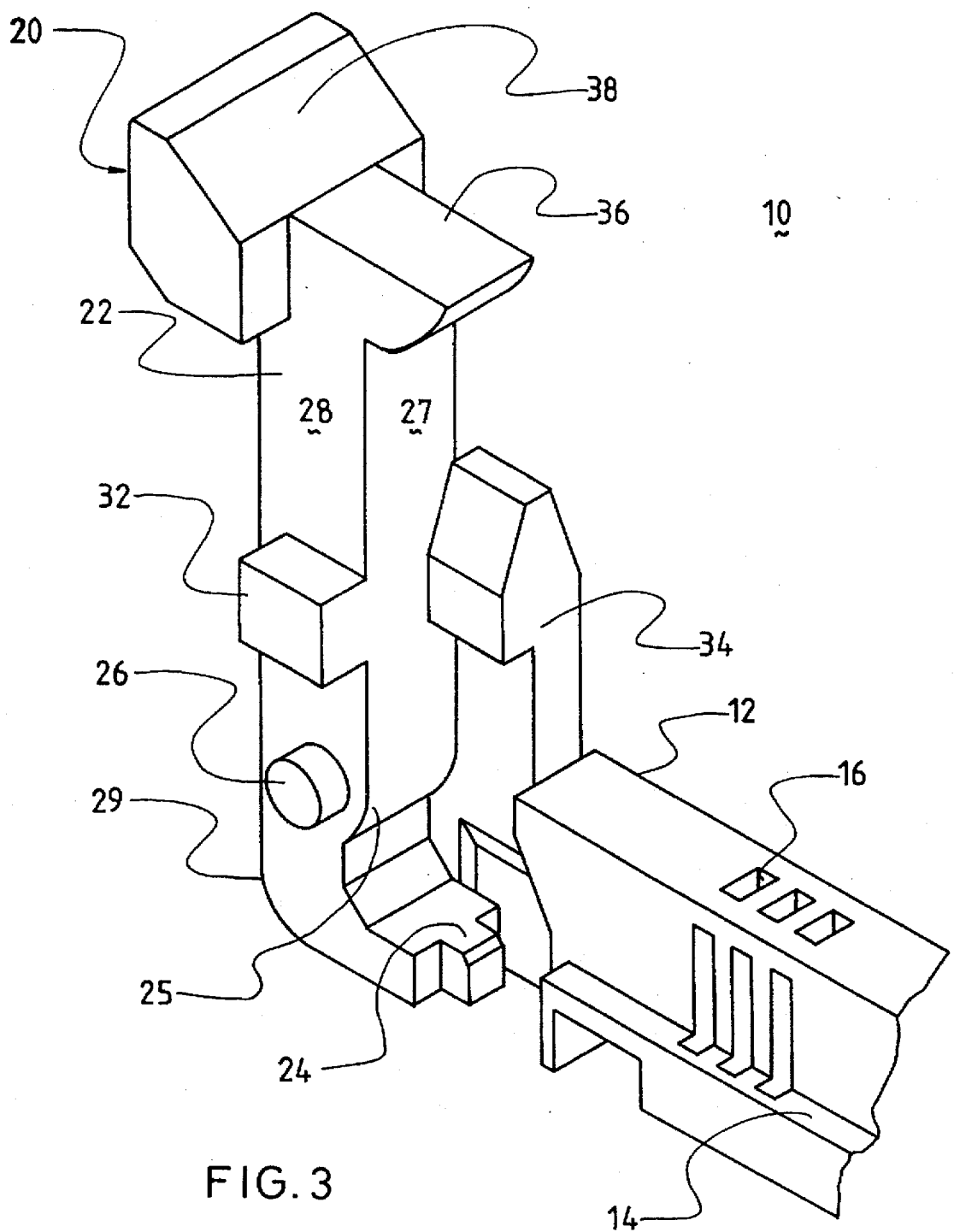
FIG. 3 is a fragmentary cut-away perspective view of the connector of FIG. 1 to show how the ejector is embedded within the cavity.
Figure 4:
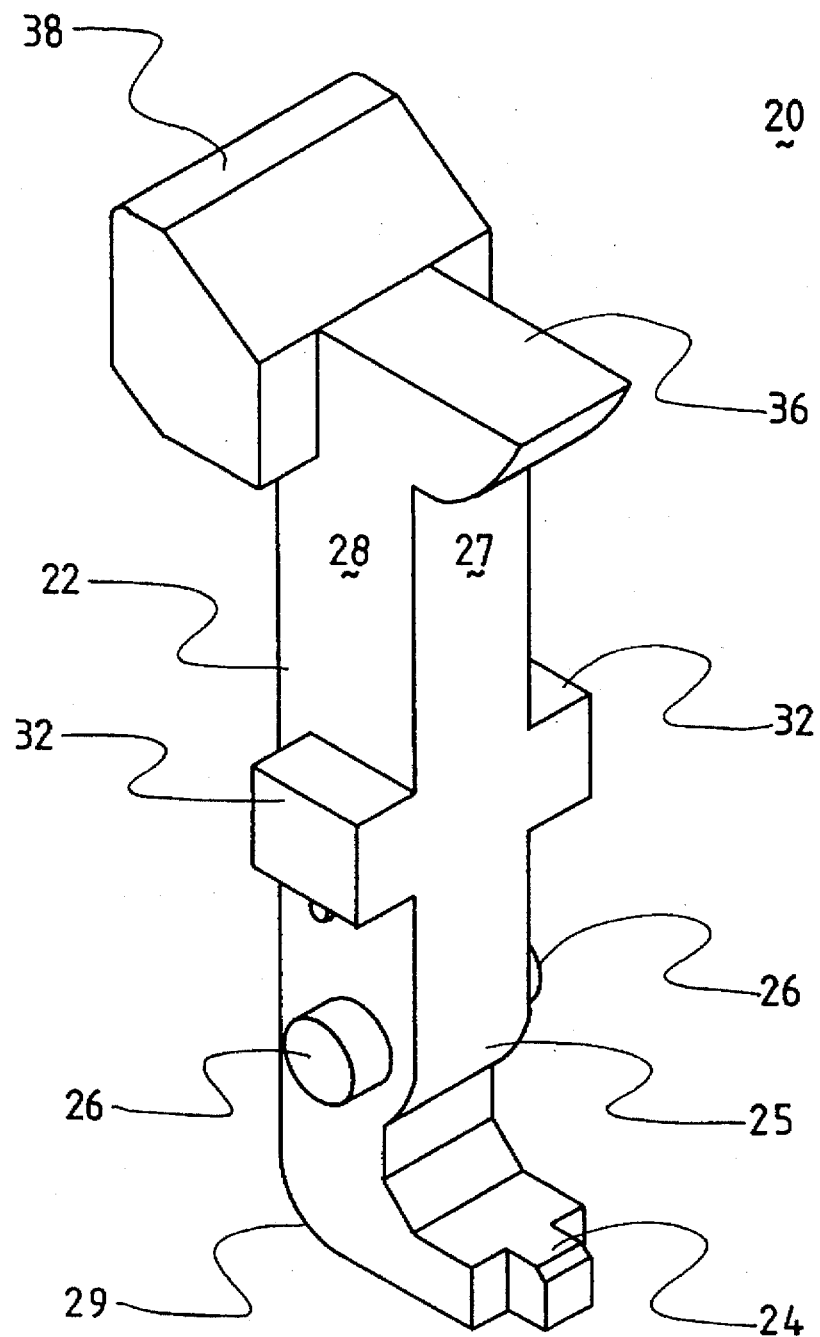
FIG. 4 is a perspective view of the ejector of the connector of FIG. 1.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 1-4, wherein a card edge connector 10 includes an insulative elongated housing 12 defining a central slot 14 for receiving a card or module 100 (FIGS. 5(A) and 5(B)) therein. A plurality of passageways 16 are formed by two sides of the slot 14 in the housing 12 for receiving therein a corresponding number of contacts (not shown) wherein a portion of each contact projects into the slot 14 for engagement with the circuit pads on the bottom edge portion of the card 100.

A cavity 18 is formed at either end of the housing 12 for receiving therein a corresponding ejector 20. The ejector 20 includes an elongated main body 22. A kicker section 24 horizontally extends toward the central slot 14 at the bottom of the main body 22. A pair of spindles 26 are formed on two side surfaces 28 of the main body 22 for reception within a pair of corresponding holes 30 in the housing 12 so that the ejector 20 may be rotatably moved within the cavity 18.

A pair of stopper blocks 32 are respectively formed on two side surfaces 28 about the middle portion of the main body 22 for engagement with a pair of retention bars 34 extending upward from the housing 12 adjacent the cavity 18 wherein the stopper block 32 is flush with the inner surface 27 of the main body 22. A locking peg 36 formed at the top of the main body 22, extends horizontally toward the slot 14 opposite to the kicker section 24 in the vertical direction. An operation section 38 extends outwardly at the top of the main body 22 opposite to the locking peg 36 in the horizontal direction.

Therefore, after the ejector 20 is assembled into the cavity 18 of the housing 12, the ejector 20 can be rotated along the spindles 26 thereof. Understandably, to avoid any improper interference occurring between the inserted card 100 and the ejector 20 during rotation of the ejector 20, the ejector 20 includes a curved section 25 on the inner surface 27; similarly, the ejector 20 further includes an arch section 29 on its outer surface around the bottom corner for not interfering with the housing 12 during rotation of the ejector 20.

Figure 5A:
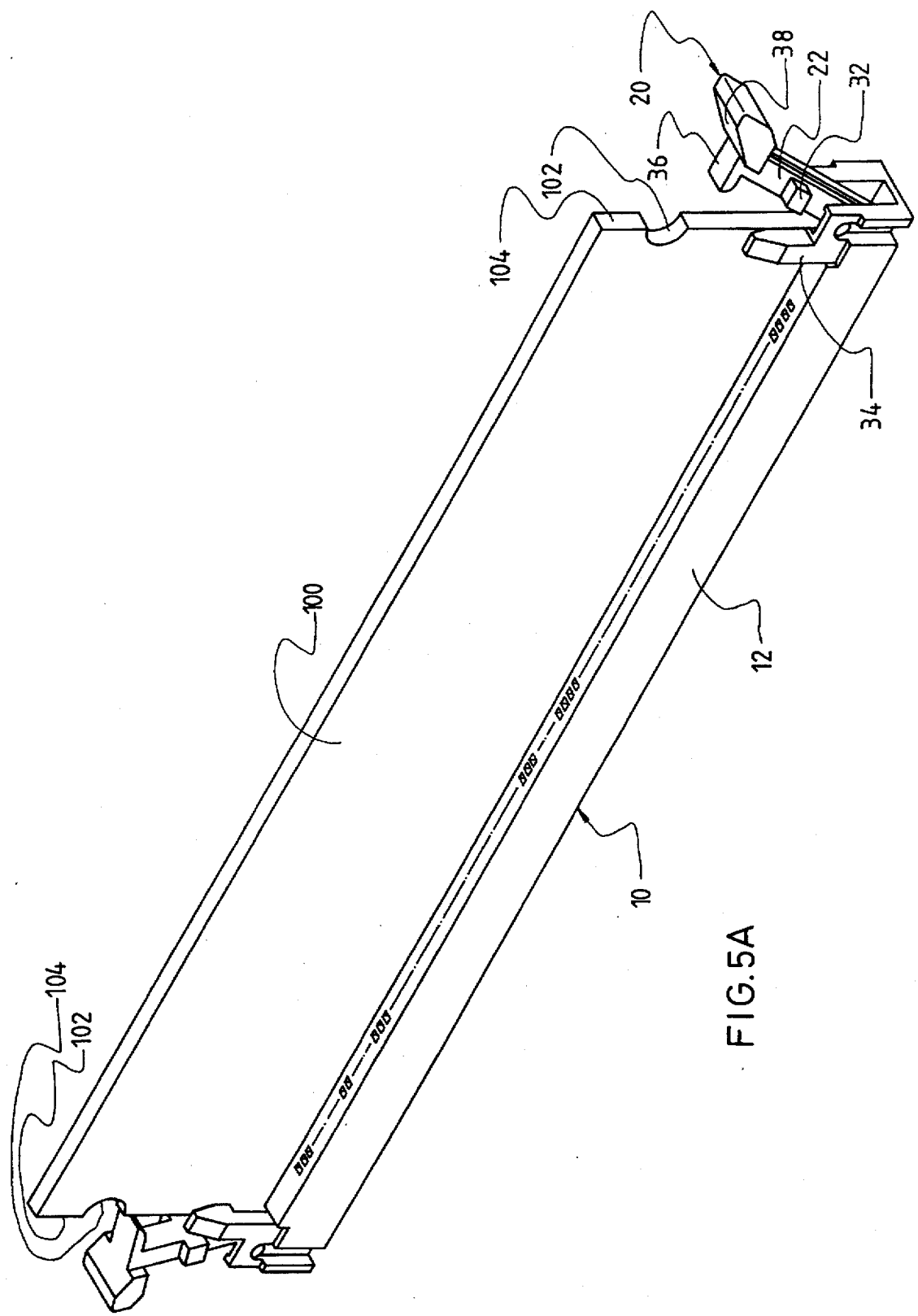
FIG. 5(A) is a fragmentary perspective view of the connector of FIG. 1 with the card being ready to be completely inserted into the housing.
Figure 5B:
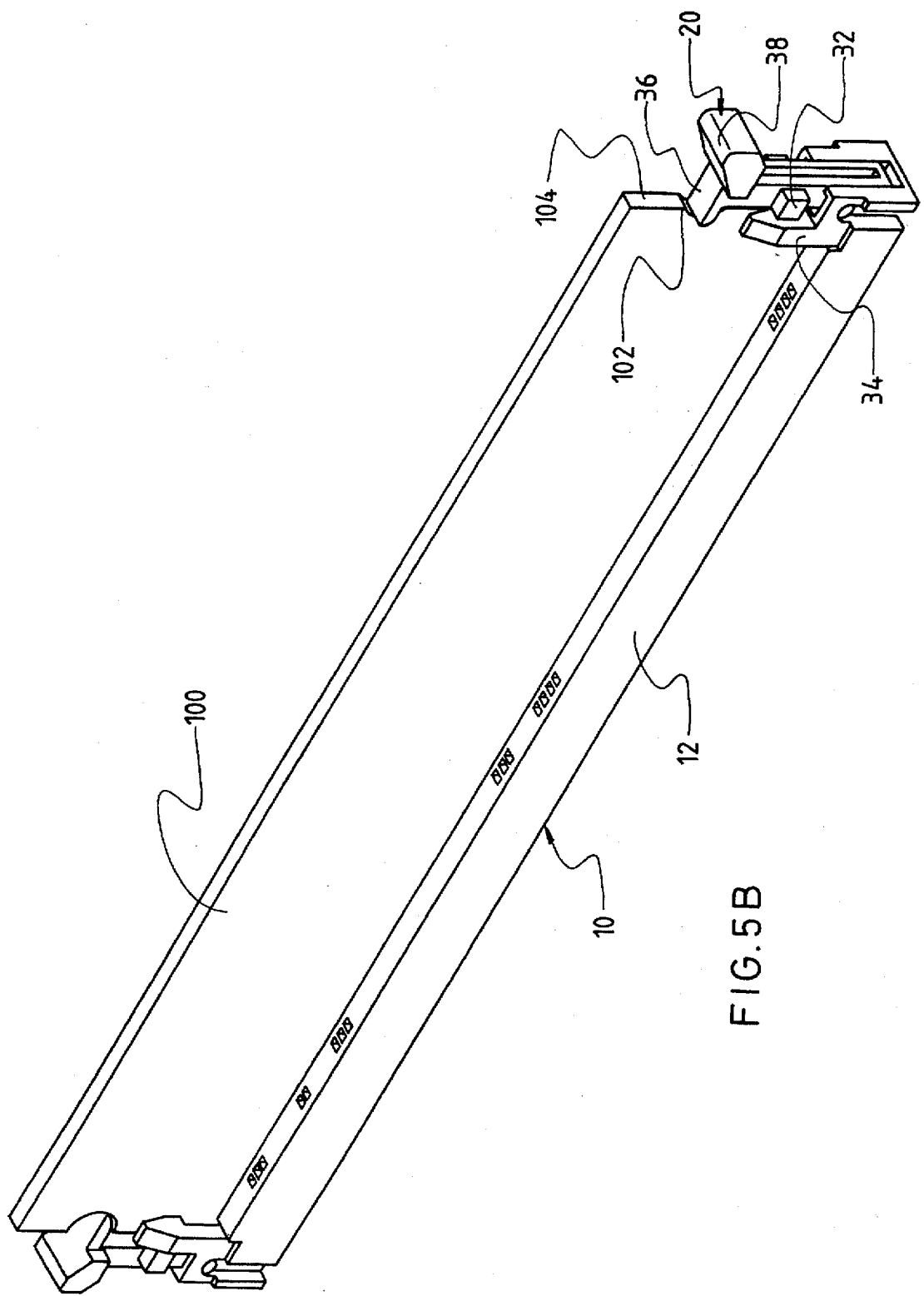
FIG. 5(B) is a fragmentary perspective view of the connector of FIG. 1 with the card being fully latchably received within the housing.

Referring to FIGS. 5(A) and 5(B), the card 100 includes a pair of notches 102 on its two side edge portions. Thus, similar to the parent application, the card 100 can be inserted into the slot 14 by its lower side edges 104 moving along the curved sections 25 of the ejectors 20 when each ejector 20 is in an open angular state. Successively, the downward movement of the card 100 can have the card 100 reach its final fixed position wherein each ejector 20 is rotatively moved to its vertical fixed position, and the locking peg 36 thereof engages within the corresponding notch 102 in the card 100. Therefore, the card 100 can be locked with regard to the housing 12 in both lengthwise direction and vertical direction.

It can be seen that similar to the parent application, the pair of retention bars 40 respectively positioned proximate the corresponding cavities 20 and by two sides of the slot 14, also sandwich the card 100 therebetween. As shown in FIGS. 1 and 5(B), the locking peg 36 of the ejector 20 is positioned above the retention bars 40. It means that in comparison with the ejector disclosed in the parent application, in the invention, through the locking peg 36, the extended main body 22 of the ejector 20 provides additional engagement with the larger (i.e., taller) card 100 for better stability of the card 100 in the connector 100. By the way, the stopper blocks 32, which confront the retention bars 34 when the ejector 20 is in its final vertical fixed position, prevent the ejector 20 from excessively inward rotation within the cavity 18.

Figure 6:
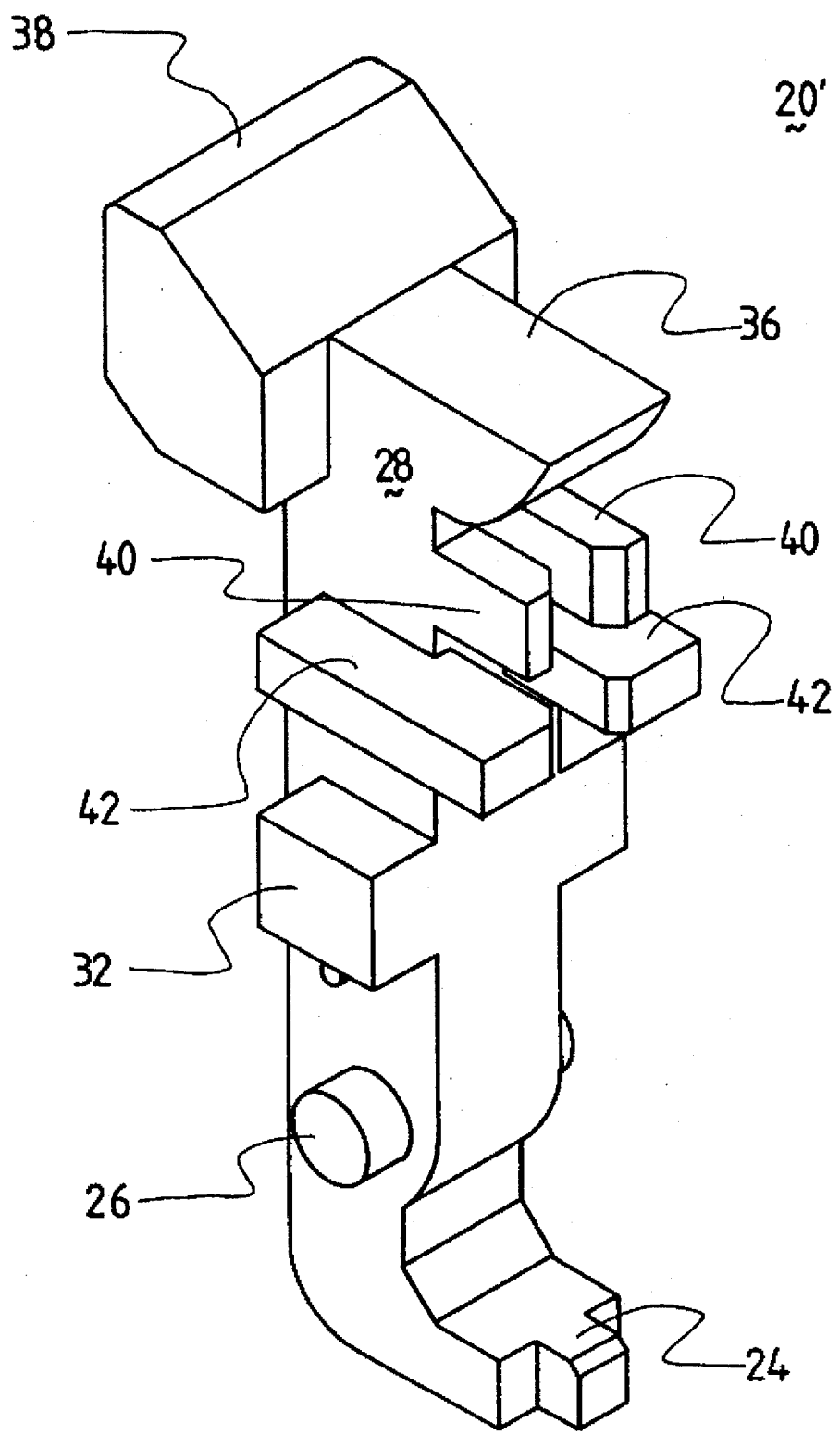
FIG. 6 is a perspective view of an ejector of the second embodiment of the card edge connector according to the invention wherein the ejector further includes alignment means extending from two side surfaces of the main body of the ejector, in comparison with that in the first embodiment.
Figure 7:
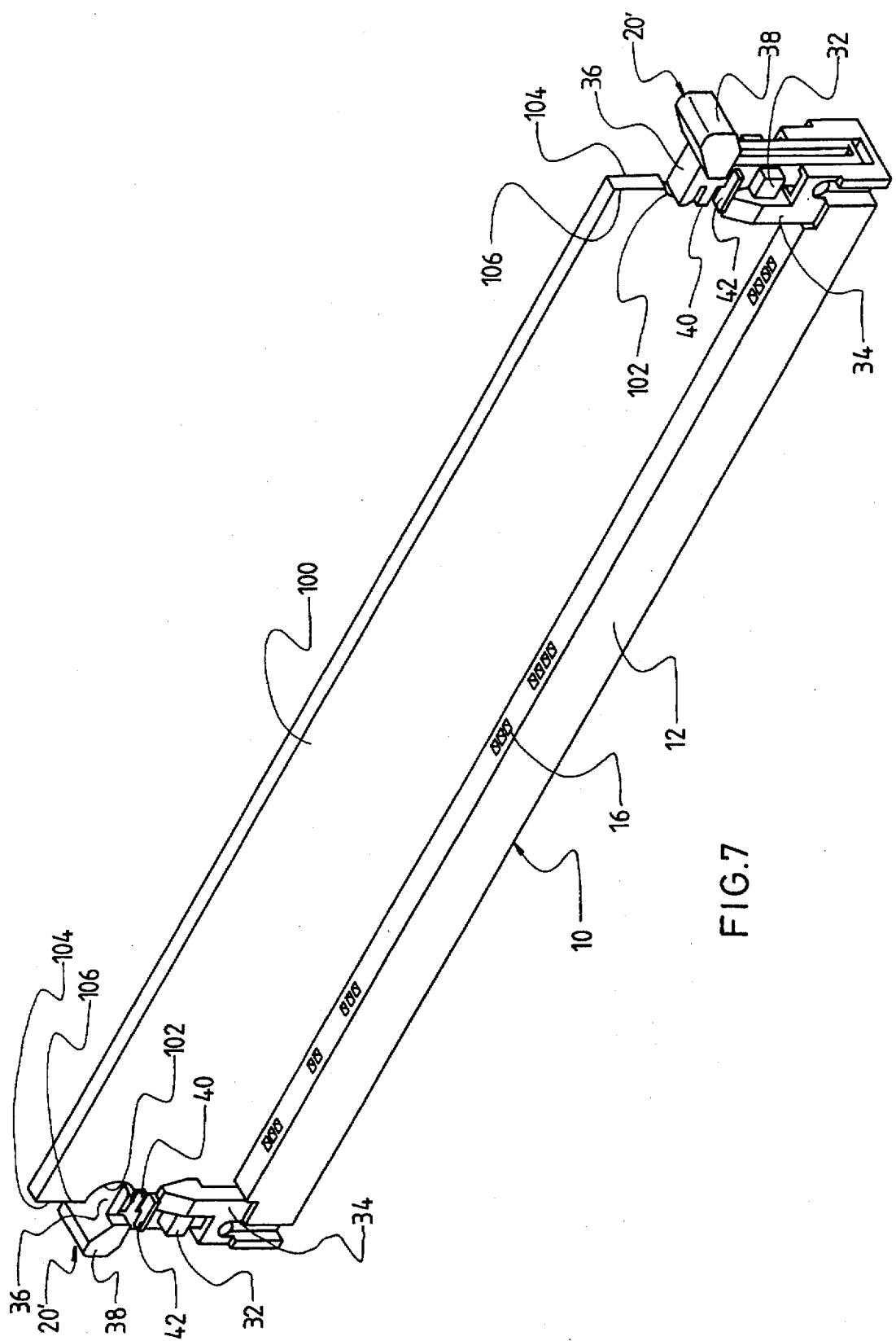
FIG. 7 is a perspective view of the assembled card edge connector of FIG. 6 having the ejector with a card received therein, wherein the edge portion of the card is sandwiched not only by the retention bars but also by the alignment means of the ejector.

FIGS. 6–7 further disclose a second embodiment of the connector with a different type ejector in comparison with the first embodiment. The ejector 20' further includes two pair of alignment arms 40 and 42 extending from the main body 22 toward the central slot 14 wherein the first pair of alignment arms 40 generally extend vertically in coplanarity with the side surfaces 28 of the main body 22 so that there is more area of first alignment arms 40 for engagement with the side edge portion 106 of the card 100. In contrast, the second pair of alignment arms 42 extend horizontally on two side surfaces 28 of the main body 22, and are designedly positioned on the top of the retention bars 34 when the ejector 20' is positioned in its final vertical position. Therefore, such second pair of alignment arms 42 not only provide alignment function for the inserted card 100 but also protectively cover the distal end of the retention bars 34 so as not to have the retention bars 34 inadvertently deflected by any improper external impact from the top.

Figure 8:
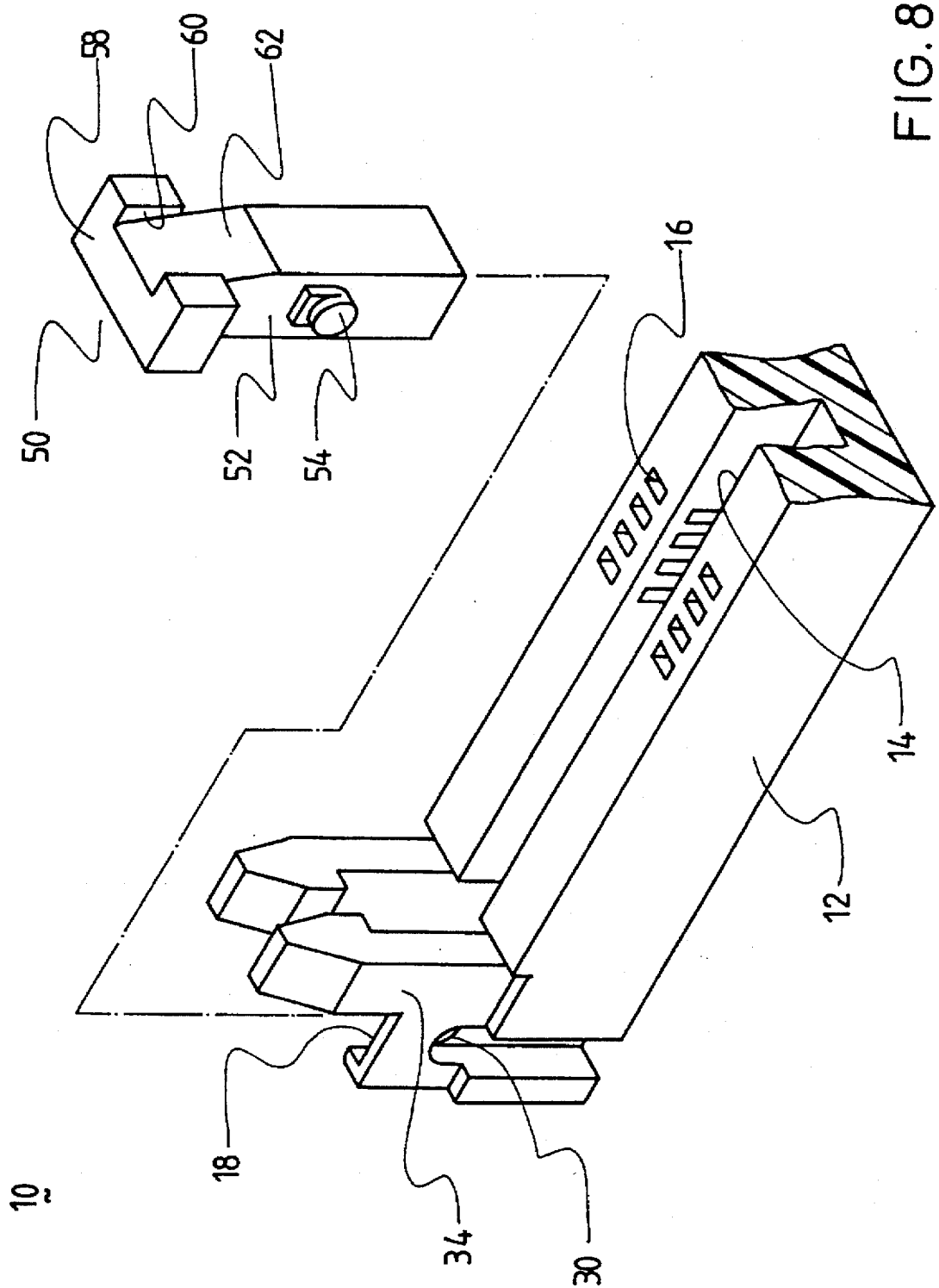
FIG. 8 is a perspective view of an ejector-like alignment post of a third embodiment of the card edge connector according to the invention.
Figure 9:
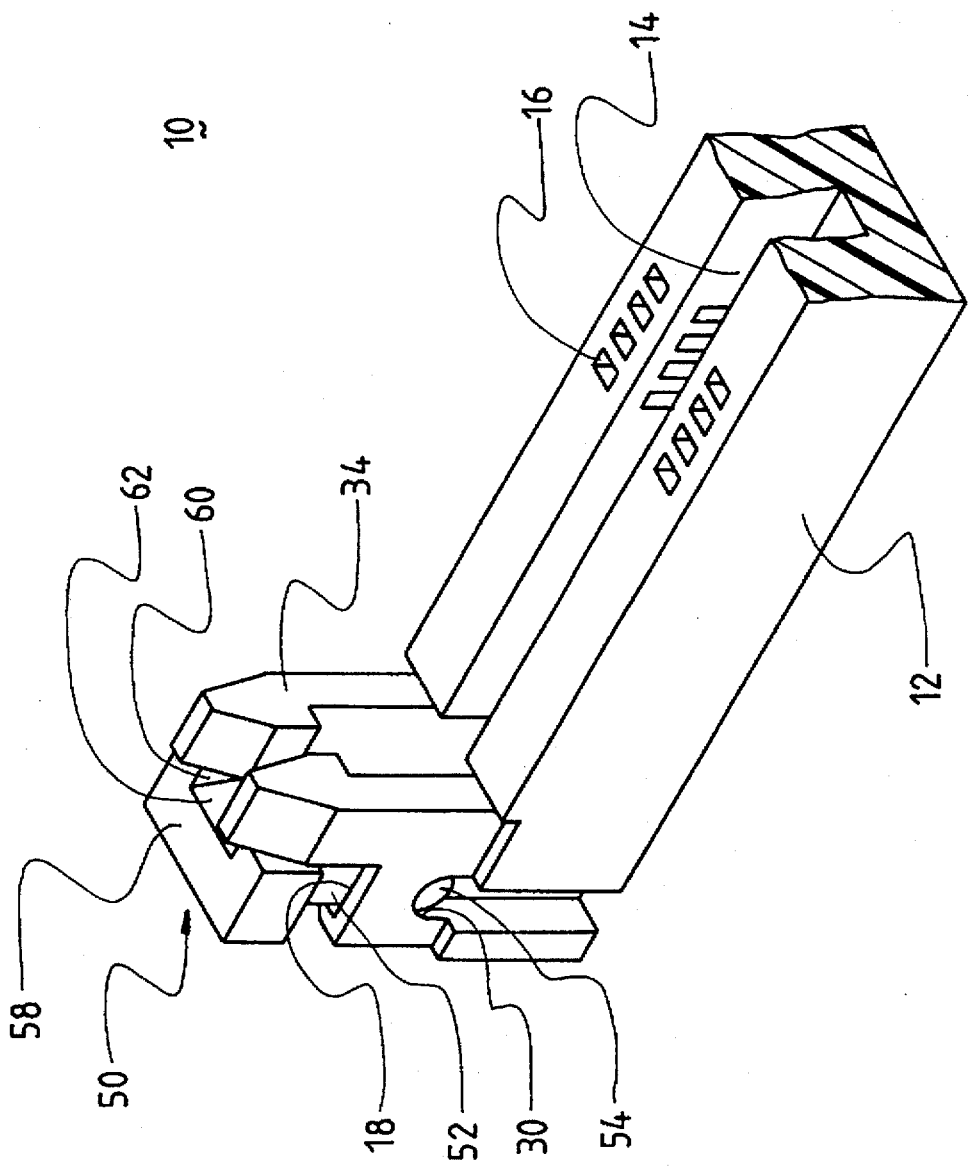
FIG. 9 is a perspective view of the assembled card edge connector of FIG. 8 having the alignment post therein.
Figure 10:
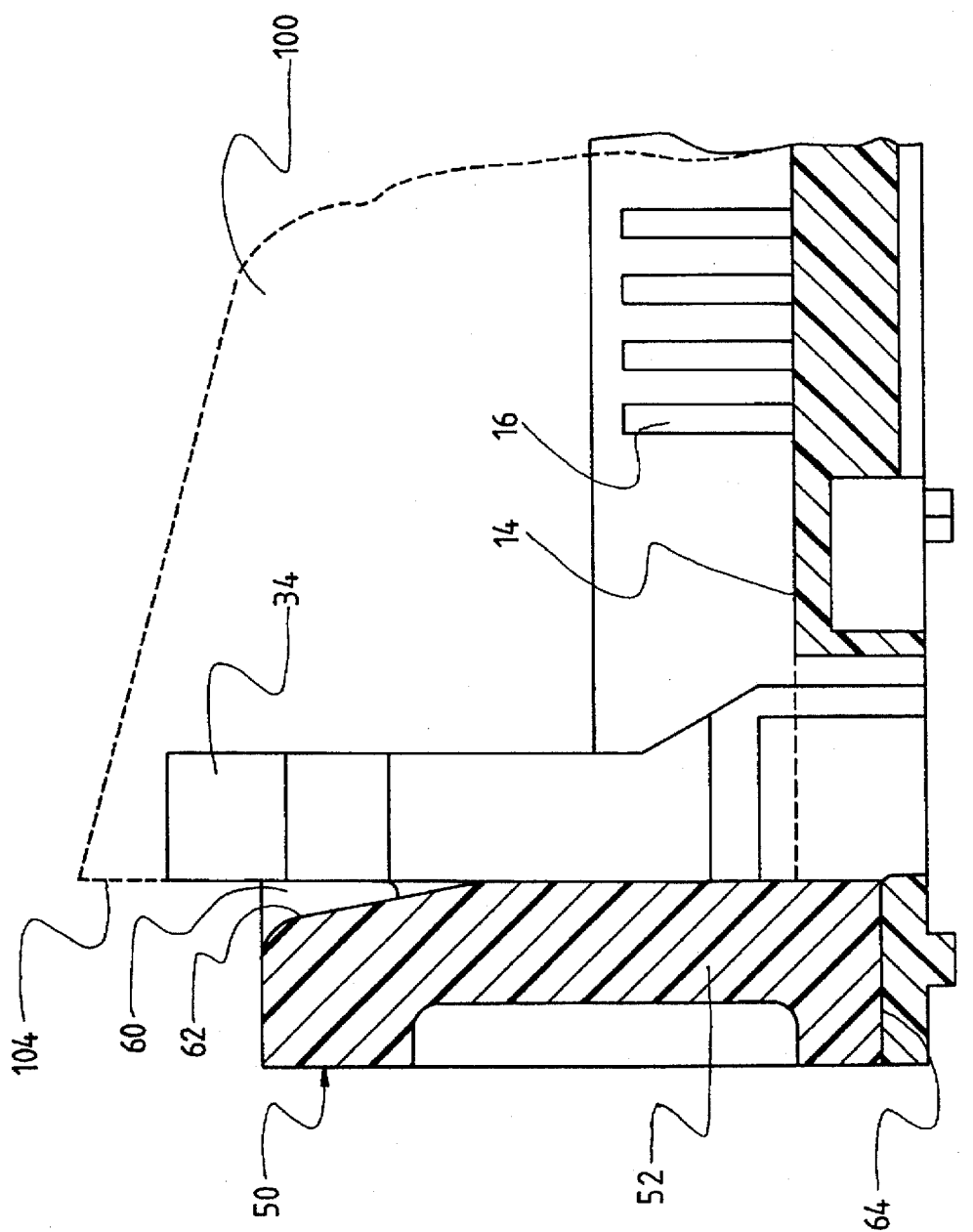
FIG. 10 is a cross-sectional view of the card edge connector of FIG. 9 having the alignment post therein.

FIGS. 8–10 disclose a third embodiment of the card edge connector having a rotatable ejector (not shown) positioned at one end of the housing 12, while have an ejector-like alignment post 50 positioned in the opposite end.

It can be understood that sometimes, to comply with the space limitation on the PC board or in the computer case, it hardly allows both of the ejectors equipped therewith at both two opposite ends of the housing because the rotatably outward movement of the ejector may interfere with the adjacent component mounted on the board. Therefore, only one ejector used with the connector housing is an alternative application although its operation for ejecting the inserted card out of the housing of the connector is not so technically good in comparison with a pair of ejectors being used at both ends of the connector housing. Anyhow, under the condition that only one ejector is used within the housing 12, an auxiliary alignment post 50 should be attached to the other end of the housing 12 because the housing itself lacks means for restriction of the inserted card in the lengthwise direction.

The alignment post 50 includes a shortened main body 52 with a pair of spindles 54 laterally extending from two side surfaces thereof for rotatable reception within the corresponding holes 30 in the housing 12. Similar to the ejector of the parent application, the alignment post 50 includes stabilization section 58 defining a channel 60 therebetween and an oblique section 62 formed in the channel 60. After assembled, the bottom of the alignment post 50 generally abuts against the support bottom surface 64 (FIG. 10) of the housing 12 and the stabilization section 58 confront the retention bars 34, and thus the alignment post 50 can not moved with regard to the housing 12 in any directions. In other words, the alignment post 50 can be deemed as functions as a fixed portion of the housing 12. Therefore, the side edge portion 106 of the inserted card 100 incorporating the rotatable ejector at the other end, can be moved along the oblique section 62 in channel 60 of the alignment post 50 in and out with regard to the housing 12.

Figure 11:
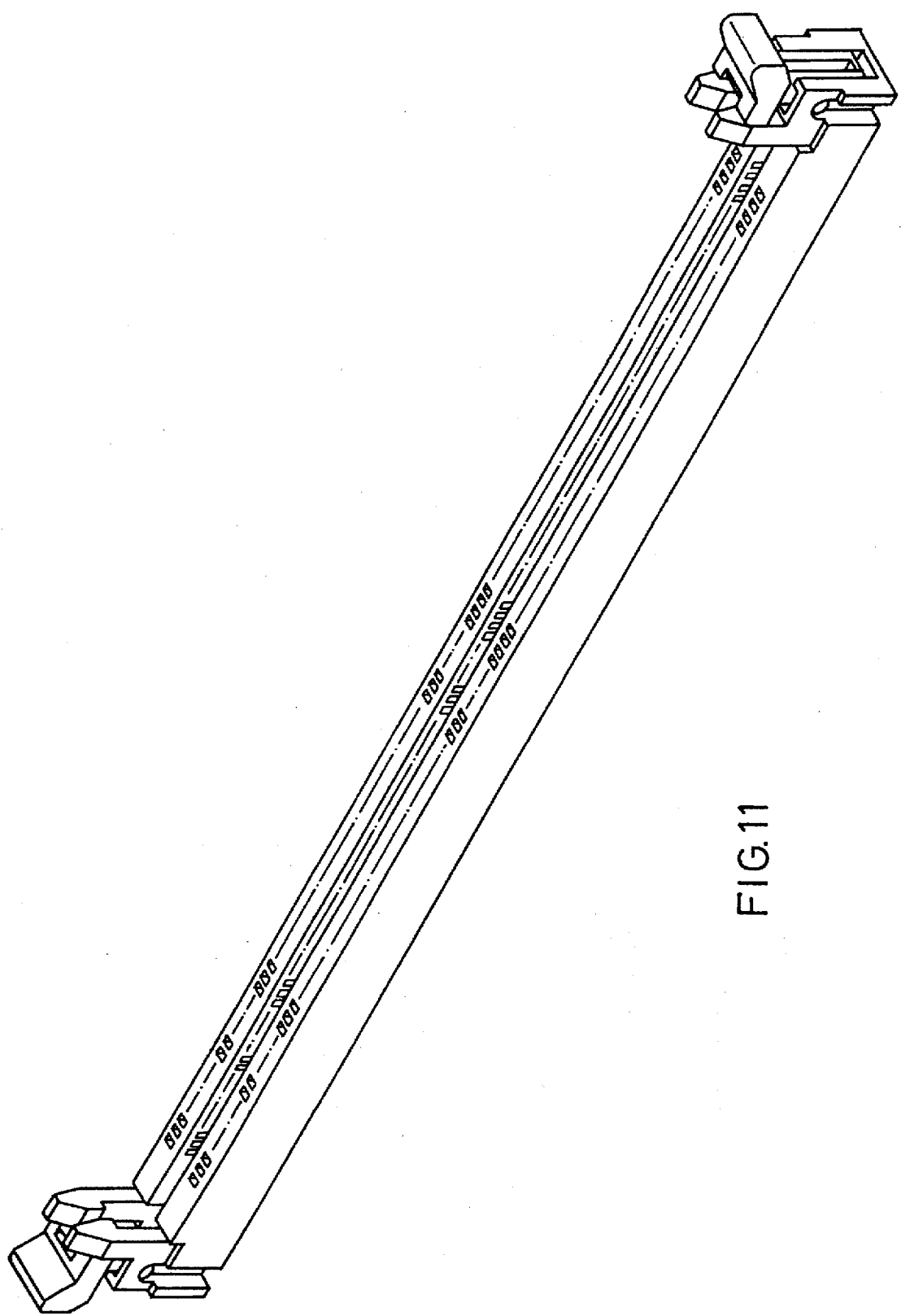
FIG. 11 is a perspective view of the card edge connector with the shorter ejector for receiving a low profile card therein as disclosed in the parent application, wherein the ejector has the similar structures, on its top portion, as those of the alignment post of FIG. 8.

The invention in this application incorporating disclosure of the parent application as shown in FIG. 11, discloses different type ejectors or alignment post, which are used in different circumstances, sharing with the same housing, thus decreasing the manufacturing cost including the mold design or inventory control.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A card edge connector comprising:
   an insulative elongated housing defining a central slot for receiving a card therein;
   a plurality of passageways positioned on two sides of the slot for receiving a corresponding number of contacts therein;
   a pair of cavities formed on two opposite ends of the housing, at least one of said cavities receiving an ejector therein;
   a pair of retention bars positioned adjacent each of the cavities;
   at least one ejector including a tall main body having a kicker section extending horizontally toward the central slot at a bottom portion thereof and a locking peg extending horizontally toward the central slot, opposite to the kicker section in a vertical direction, at a top portion of the main body, wherein said ejector further includes a pair of stopper blocks laterally extending from two side surfaces of the main body, and each stopper block is substantially always located outside said cavity whenever the locking peg of said ejector either locks or unlocks the card.

2. The connector as described in claim 1, wherein said locking peg is substantially positioned above the retention bars in a distance.

3. The connector as described in claim 1, wherein said ejector further includes a curved section on an inner surface and an arch section on an outer surface.

4. The connector as described in claim 1, wherein said stopper blocks are formed on a middle portion of the main body.

5. The connector as described in claim 1, wherein said ejector further includes a first pair of vertical alignment arms extending toward the central slot and generally in coplanarity with two corresponding side surfaces, respectively.

6. The connector as described in claim 5, wherein said ejector further includes a second pair of horizontal alignment arms laterally extending from two side surfaces above the top of the corresponding retention bars, respectively.

7. The connector as described in claim 1, wherein each one stopper block is able to restrain the ejector from rotatably moving toward the central slot when said stopper block engages with a corresponding retention bar.

8. A card edge connector for use with a card, comprising:

an insulative elongated housing defining a central slot for receiving the card therein;

a plurality of passageways positioned on two sides of the slot for receiving a corresponding number of contacts therein;

a pair of cavities formed on two opposite ends of the housing for receiving at least a rotative ejector therein;

a pair of retention bars positioned adjacent each of the cavity; and an alignment post positioned in one of said cavities opposite to said ejector, said alignment post including a shortened main body having a stabilization section at a top portion with a channel having an oblique section guiding but not retaining the inserted card and said channel in the stabilization section being in alignment with the central slot wherein a bottom surface of the alignment post abuts against a floor surface of the housing and the stabilization section engages the corresponding retention bars whereby said alignment post is retained within the corresponding cavity without possibility of movement.

9. An arrangement for connecting a card to a mother board, comprising:

an insulative elongated housing mounted on the mother board;

said housing defining a central slot for receiving said card therein and a plurality of contacts positioned by two sides of the slot for engagement with circuit pads on the card;

at least a cavity formed at one lengthwise end of the housing for receiving a rotatable ejector therein;

a pair of retention bars positioned adjacent said cavity; wherein when said card is a first type card which is of a shorter type or the card is substantially in a vertical use manner, a first type ejector can be assembled into the cavity for cooperation with the first type card, and said first type ejector has a shorter body including a stabilization section at the top defining a channel having oblique section guiding but not retaining the inserted card for alignment with the central slot whereby said stabilization section is engaged with the retention bars; alternately, when said card is a second type card which is of a taller type or the card is substantially in a horizontal use manner, a second type ejector can be assembled into the cavity for cooperation with the second type card, and said second type ejector includes a long main body having a pair of stopper blocks on two side surfaces and a locking peg at a top portion whereby said stopper blocks are outside the cavity for engagement with the retention bars and the locking peg extends toward the central slot above the retention bars for engagement within a notch formed on an edge portion of the second type card.

10. The arrangement as described in claim 9, wherein said housing further includes another cavity on an opposite end of the housing, and an alignment post can be optionally assembled thereto, said alignment post including a stabilization section defining a channel therein in alignment with the central slot as the first type ejector does, and further including a bottom surface of the alignment post whereby said bottom surface abuts against a floor surface of the housing and the stabilization section engages the retention bars for securing the alignment post in the cavity without movement.

11. A card edge connector comprising:

an insulative elongated housing defining a central slot for receiving a card therein;

a plurality of passageways positioned on two sides of the slot for receiving a corresponding number of contacts therein;

a pair of cavities formed on two opposite ends of the housing at least one of said cavities receiving an ejector therein;

a pair of retention bars positioned adjacent each of the cavities;

at least one ejector including a tall main body having a kicker section extending horizontally toward the central slot at a bottom portion thereof and a locking peg extending horizontally toward the central slot, opposite to the kicker section in vertical direction, at a top portion of the main body, wherein said ejector further includes a pair of stopper blocks laterally extending from two side surfaces of the main body, and each stopper block is engaged with a corresponding retention bar for restraining the ejector from further rotatably moving toward the central slot when the locking peg of said ejector locks the card.

* * * * *